United States Patent
Kim (10) Patent No.: US 8,743,547 B2
(45) Date of Patent: Jun. 3, 2014

(54) ELECTRONIC DEVICE HAVING COOLING STRUCTURE

(75) Inventor: Hee-dong Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 330 days.

(21) Appl. No.: 13/222,493

(22) Filed: Aug. 31, 2011

(65) Prior Publication Data

US 2012/0050985 A1  Mar. 1, 2012

(30) Foreign Application Priority Data

Aug. 31, 2010  (KR) .................. 10-2010-0084958

(51) Int. Cl.
*H05K 7/20* (2006.01)

(52) U.S. Cl.
USPC ...... 361/715; 361/679.47; 361/709; 361/719; 174/15.2; 174/260; 174/548

(58) Field of Classification Search
USPC ........ 361/679.46–679.54, 688–722, 760, 831
See application file for complete search history.

(56) References Cited

U.S. PATENT DOCUMENTS

| | | | | |
|---|---|---|---|---|
| 6,052,285 A | * | 4/2000 | Hileman | 361/699 |
| 2005/0117296 A1 | * | 6/2005 | Wu et al. | 361/697 |
| 2006/0146497 A1 | | 7/2006 | Gauche et al. | |
| 2007/0035931 A1 | * | 2/2007 | Kuo et al. | 361/719 |
| 2008/0062649 A1 | * | 3/2008 | Leng et al. | 361/700 |

FOREIGN PATENT DOCUMENTS

| KR | 10-2006-0074141 A | 7/2006 |
|---|---|---|
| KR | 20-2008-0001652 U | 6/2008 |

\* cited by examiner

*Primary Examiner* — Courtney Smith
(74) *Attorney, Agent, or Firm* — Sughrue Mion, PLLC

(57) ABSTRACT

An electronic device having a heat dissipating component is provided. The electronic device includes a circuit board, a heat pipe which is disposed on a first side of the circuit board, a heat generating device which is disposed on a second side of the circuit board opposite to the first side, a heat sink placed which is disposed on a surface of the heat generating device and absorbs heat of the heat generating device, and a connecting member which penetrates through the circuit board and thermoconductively connects the heat pipe and the heat sink.

20 Claims, 9 Drawing Sheets

ELECTRONIC DEVICE HAVING COOLING STRUCTURE

CROSS-REFERENCE TO RELATED APPLICATION

This application claims priority from Korean Patent Application No. 10-2010-0084958 filed on Aug. 31, 2010 in the Korean Intellectual Property Office, the contents of which are herein incorporated in its entirety by reference.

BACKGROUND

1. Field

Apparatuses consistent with exemplary embodiments relate to an electronic device having a heat dissipating component.

2. Description of the Related Art

With advances in lightweight and compact electronic devices, an internal space of an electronic device has been becoming increasingly smaller. According to the development of high-speed electronic devices, however, internal electrical components of the electronic devices tend to produce more heat. To ensure a stable and reliable operation of the electronic device, cooling of the internal electrical components is required. For example, heat generating components of a portable computer requiring cooling include a central processing unit (CPU) and a memory controller hub (MCH). With the recent high-speed operation of a memory, a memory card is also recognized as a heat generating component requiring cooling.

In a portable computer, for example, a memory card may be mounted on a top surface of a main circuit board, where a CPU or other main components are mounted. However, to facilitate mounting or dismounting of the memory card, the memory card may also be mounted on a bottom surface of the main circuit board.

A cooling system used for a CPU, an MCH and so on cannot be used with the memory card mounted on the bottom surface of the main circuit board. Thus, there are no cooling means other than indirect cooling based on convection of internal air.

As a result, the memory increases the internal temperature up to higher than a standard temperature, which may, in turn, cause a problem in that the memory cannot cope with the stable and reliable operation. In particular, as the memory operation becomes faster, overheating of the memory becomes more problematic. Accordingly, there is a need for additional cooling system for the memory.

SUMMARY

Exemplary embodiments provide an electronic device which may effectively cool a heat generating device mounted on a bottom surface of a circuit board.

According to an aspect of an exemplary embodiment, there is provided an electronic device including a circuit board; a heat pipe which is disposed on a first side of the circuit board; a heat generating device which is disposed on a second side of the circuit board opposite to the first side of the circuit board; a heat sink which is disposed on the second side of the circuit board and absorbs heat generated by the heat generating device; and a connecting member which penetrates through the circuit board and thermoconductively connects the heat pipe and the heat sink.

According to an aspect of another exemplary embodiment, there is provided an electronic device including a circuit board; a heat pipe which is disposed on a first side of the circuit board; a memory card which is disposed on a second side of the circuit board opposite to the first side of the circuit board; a first heat sink which is disposed on the second side of the circuit board, and is thermoconductively connected to the memory card to absorb heat of the memory card; and a connecting member which penetrates the circuit board and thermoconductively connects the heat pipe and the first heat sink.

According to an aspect of still another exemplary embodiment, there is provided an electronic device including a circuit board; a heat pipe which is disposed on a first side of the circuit board; a memory card which is disposed on a second side of the circuit board opposite to the first side of the circuit board; a lower housing which accommodates the circuit board and has an opening located at a position corresponding to the memory card and exposing the memory card; a cover which covers the opening; a first heat sink which is disposed on the second side of the circuit board, and is thermoconductively connected to the memory card to absorb heat generated by the memory card; and a connecting member which penetrates through the circuit board and thermoconductively connects the heat pipe and the first heat sink.

BRIEF DESCRIPTION OF THE DRAWINGS

The above and other aspects will become more apparent by describing in detail exemplary embodiments with reference to the attached drawings in which.

DETAILED DESCRIPTION

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. Like numbers refer to like elements throughout.

Exemplary embodiments described herein will be described referring to plan views and/or cross-sectional views by way of ideal schematic views of the inventive concept. Accordingly, the exemplary embodiments may be modified depending on manufacturing technologies and/or tolerances. Therefore, the exemplary embodiments are not limited to those the exemplary embodiments shown in the views, but may include modifications in configuration formed on the basis of manufacturing processes. Therefore, regions exemplified in figures have schematic properties and shapes of regions shown in figures exemplify specific shapes of regions of elements and not limit aspects of the inventive concept.

Hereinafter, exemplary embodiments will be described with regard to a portable computer. However, it will be apparent to those skilled in the art that the present inventive concept can be applied to electronic device having a heat generating device requiring cooling, such as a tablet, a personal digital assistant (PDA) or the like.

Figure 1:
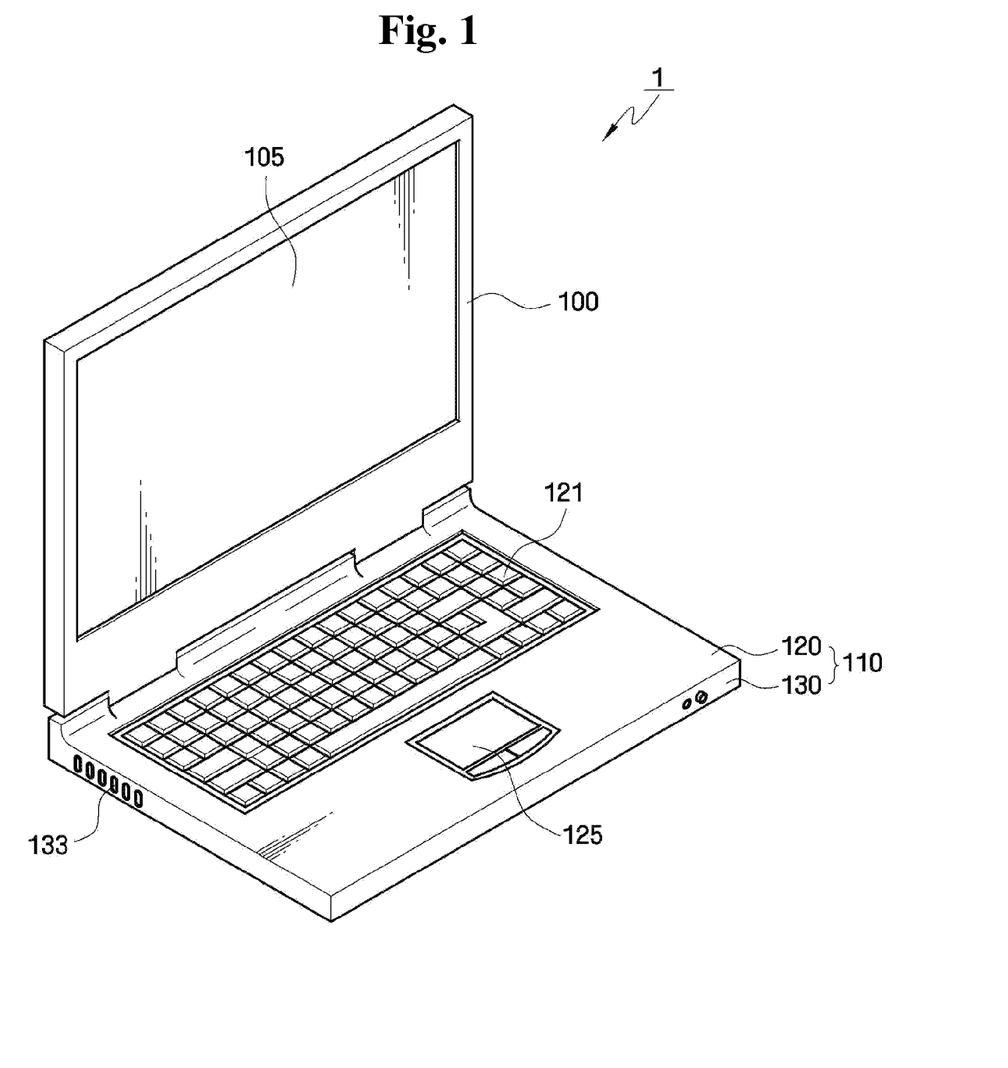
FIG. 1 is a perspective view of a portable computer according to an exemplary embodiment.

A portable computer according to an embodiment will now be described. FIG. 1 is a perspective view of a portable computer according to an exemplary embodiment, and FIG. 2 is an exploded perspective view of the portable computer shown in FIG. 1.

Figure 2:
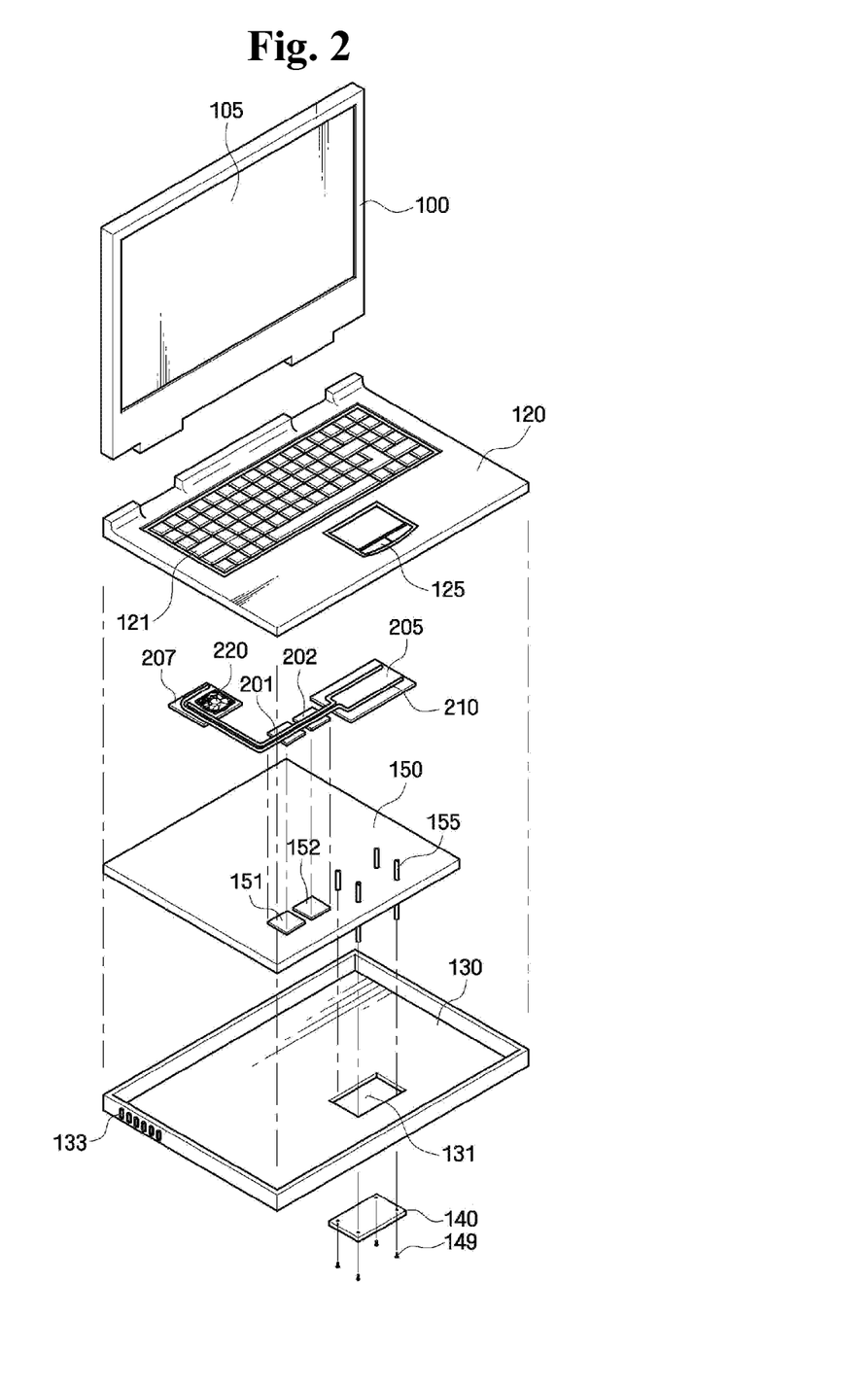
FIG. 2 is an exploded perspective view of the portable computer shown in FIG. 1.

Referring to FIGS. 1 and 2, the portable computer 1 includes a lid 100 and a main body 110.

One side surface of the lid 100 is connected to a rear end of the main body 110 by a hinge assembly. The lid 100 is closely attached to a top surface of the main body 110 to cover the top surface of the main body 110 and is unfolded at a predetermined angle with respect to the main body 110. The lid 100 may include a liquid crystal display 105 that displays images on a screen surface facing the main body 110.

The main body 110 includes a lower housing 130 and an upper housing 120 covering a top surface of the lower housing 130. A keyboard 121 and a mouse 125 may be provided on a surface of the upper housing 120 to receive user inputs.

The lower housing 130 may have a hexahedron shape having an open top surface, but not limited thereto. A vent hole 133 may be formed in one sidewall of the lower housing 130. Although FIG. 2 illustrates the vent hole 133 is formed in a left sidewall of the lower housing 130, the inventive concept is not limited thereto. The vent hole 133 discharges internal air of the main body 110 to the outside of the main body 110, thereby releasing the internal heat of the main body 110 to the outside.

The circuit board 150 and the heat pipe 210 may be accommodated in a space defined by the upper housing 120 and the lower housing 130. The circuit board 150 may have various heat generating devices mounted therein. Examples of the heat generating devices may include semiconductor devices, such as a memory card, a central processing unit (CPU) 151, a memory controller hub (MCH) 152, or the like. The memory card may be mounted on a bottom surface of the circuit board 150 and the CPU 151 and the MCH 152 may be mounted on a top surface of the circuit board 150.

The heat pipe 210 is placed on the top surface of the circuit board 150. In general, the heat pipe 210 has a shape of a closed pipe vessel filled with an operating fluid and having a porous wick formed on the inner wall thereof. The heat pipe 210 is comprised of an evaporating section, an insulating section, and a condensing section. The evaporating section absorbs heat from an external heat source, and the operating fluid is evaporated in a gas state. Here, the operating fluid moves from the evaporating section to the condensing section due to an expansion force. Conversely, the condensing section allows the operating fluid to be condensed from a gas state to a liquid state while desorbing the heat by a cooling fan. The condensed liquid operating fluid moves to the evaporating section due to a capillary force of the wick. This procedure is continuously repeated to effectively transfer the heat from the evaporating section to the condensing section.

In this exemplary embodiment, the heat pipe 210 is disposed over the CPU 151 and the MCH 152. Thus, the heat pipe 210 may absorb the heat generated from the CPU 151 and the MCH 152. However, since the memory card is mounted on the bottom surface of the circuit board 150, it does not directly contact the heat pipe 210.

A connecting member 155 penetrates the circuit board 150 and transfers the heat generated from the memory card mounted on the bottom surface of the circuit board 150 to the heat pipe 210 mounted on the top surface of the circuit board 150. In such a manner, the heat pipe 210 may absorb the heat generated from the memory card.

One end of the heat pipe 210 is disposed at a region where a memory card is mounted, and the other end of the heat pipe 210 is disposed at a region adjacent to the vent hole 133 of the lower housing 130. That is, the one end of the heat pipe 133 disposed at the memory card mounting region functions as an evaporating section, and the other end of the heat pipe 210 disposed at the region adjacent to the vent hole 133 of the lower housing 130 functions as a condensing section. Therefore, the heat pipe 133 may transfer the heat generated from the memory card to the vent hole 133.

The heat pipe 210 and the connecting member 155 may be thermoconductively connected to each other through the heat sink 205 interposed therebetween, but embodiments are not limited thereto. For example, the heat pipe 210 and the connecting member 155 may be directly connected to each other without the heat sink 205. The heat sink 205 absorbs the heat of the connecting member 155 and disperses the absorbed heat to a surface of the heat sink 205. Thus, since a contact area between the connecting member 155 and the heat pipe 210 is increased, the heat can be effectively transferred to the heat pipe 210.

A cooling fan 220 is disposed at a region adjacent to the other end of the heat pipe 210. In detail, the other end of the heat pipe 210 contacts the heat sink 205, and the heat sink 205 absorbs the heat of the heat pipe 210. The cooling fan 220 blows air over the heat sink 205 to discharge the heat of the heat sink 205 to the outside of the main body 110 through the vent hole 133 formed in the sidewall of the lower housing 130.

An opening 131 is formed on the bottom surface of the lower housing 130. The opening 131 is formed on a region of the bottom surface of the lower housing 130, the region corresponding to the memory card. The opening 131 exposes the memory socket to the outside, thereby allowing the memory card to be easily attached to or detached from the memory socket. The opening 131 may be covered by the cover 140.

Figure 3:
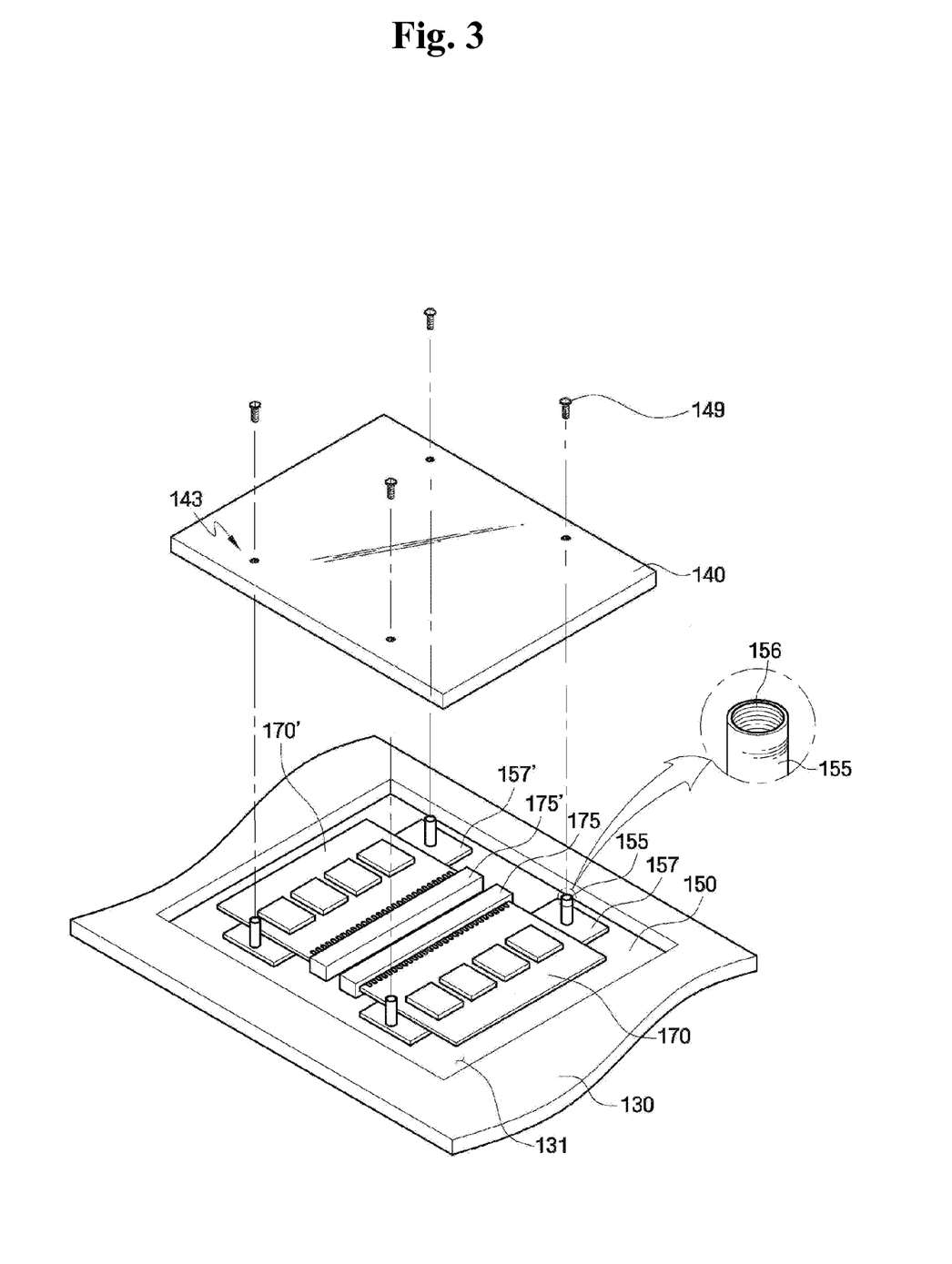
FIG. 3 illustrates an opening formed in a lower housing of the portable computer shown in FIG. 1.

FIG. 3 illustrates an opening formed in a lower housing of the portable computer shown in FIG. 1.

The illustrated embodiment shows that the portable computer includes two memory sockets 175 and 175', two memory cards 170 and 170', and two memory heat sinks 157 and 157', but the present inventive concept is not limited thereto.

The opening 131 formed on the bottom surface of the lower housing 130 exposes the bottom surface of the circuit board 150. The memory socket 175 may be attached to the bottom surface of the circuit board 150 exposed by the opening 131. The memory card 170 is inserted into the memory socket 175 substantially in parallel with the circuit board 150. The memory heat sink 157 is formed on the bottom surface of the circuit board 150 facing the memory card 170. The memory heat sink 157 is substantially rectangular and made of a highly thermoconductive material such as copper, aluminum, or a tungsten-copper alloy.

When the memory card 170 is inserted into the memory socket 175, the memory heat sink 157 closely contacts one surface of the memory card 170 and is thermoconductively contacted thereto. For example, the memory heat sink 157 may directly contact the one surface of the memory card 170. In addition, the memory heat sink 157 may be thermoconductively connected to the one surface of the memory card 170 through a thermal compound 180 (see FIG. 4) interposed between the one surface of the memory card 170 and the memory heat sink 157. The memory heat sink 157 thermoconductively contacting the one surface of the memory card 170 absorbs the heat generated from the memory card 170.

The connecting member 155 penetrates the circuit board 150 and is thermoconductively connected to the memory heat sink 157. The connecting member 155 may be a thread pipe penetrating the circuit board 150 and the memory heat sink 157 and made of a thermoconductive material, but embodiments are not limited thereto. Since the connecting member 155, that is, the thread pipe, thermoconductively contacts the memory heat sink 157 at a portion where the memory heat sink 157 penetrates, the heat of the memory heat sink 157 may be transferred to the top surface of the circuit board 150 through the thread pipe.

The cover 140 is engaged with the thread pipe 155 to cover the opening 131. For example, one end of the thread pipe 155 contacts the cover 140, and a female thread 156 may be formed on the inner surface of the one end thereof contacting the cover 140. A through-hole 143 may be formed at a portion of the cover 140 contacting the thread pipe 155. A bolt 149 is inserted into the through-hole 143 to then be engaged with the female thread 156 formed in the thread pipe 155. Therefore, the cover 140 may be fixed to the thread pipe 155 and may cover the opening 131.

Figure 4:
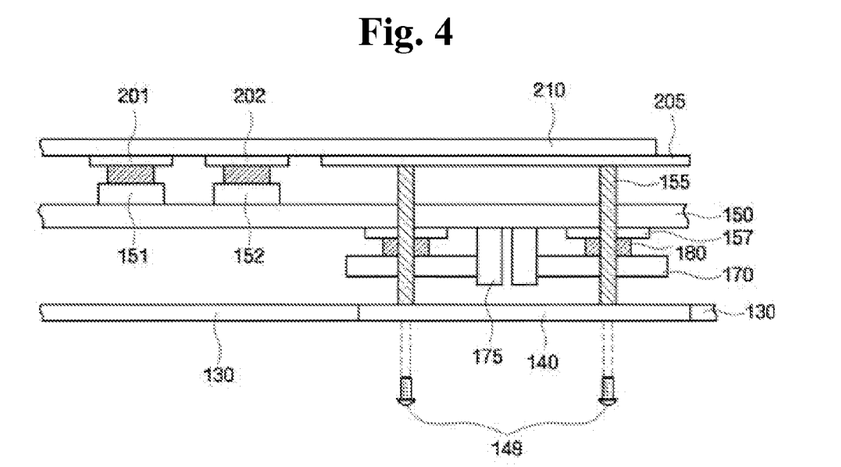
FIG. 4 illustrates a connection relationship between a circuit board, a heat pipe and a memory card of the portable computer shown in FIG. 1.

FIG. 4 illustrates a connection relationship between a circuit board, a heat pipe and a memory card of the portable computer shown in FIG. 1. Referring to FIG. 4, the memory socket 175 is attached to the bottom surface of the circuit board 150, and the memory card 170 is inserted into the memory socket 175. The memory heat sink 157 may be formed in a region of the bottom surface of the circuit board 150 facing the memory card 170. The memory card 170 is thermoconductively connected to the memory heat sink 157. For example, the memory card 170 may directly contact the memory heat sink 157 and may be thermoconductively connected to the memory heat sink 157 through the thermal compound 180 interposed between the memory heat sink 157 and the memory card 170.

The thread pipe 155 penetrates the memory heat sink 157 and the circuit board 150 and thermoconductively connects the memory heat sink 157 disposed on the bottom surface of the circuit board 150 to the heat pipe 210 disposed on the top surface of the circuit board 150. For example, the heat sink 205 may be disposed over the thread pipe 155 and the heat pipe 210 may be disposed over the heat sink 205, but embodiments are not limited thereto. For example, the thread pipe 155 may directly contact the heat pipe 210 without the heat sink 205.

Therefore, the heat generated from the memory card 170 is absorbed by the memory heat sink 157, and the heat absorbed by the memory heat sink 157 is transferred to the heat pipe 210 through the thread pipe 155.

The heat pipe 210 may be disposed over the CPU 151 and the MCH 152, and may absorb the heat generated from the CPU 151 and the MCH 152. For example, the heat sinks 201 and 202 may be disposed on top surfaces of the CPU 151 and the MCH 152, and the heat pipe 210 may contact the heat sinks 201 and 202 disposed on the top surfaces of the CPU 151 and the MCH 152. Therefore, the heat generated from the CPU 151 and the MCH 152 may be transferred to the heat pipe 210 through the heat sinks 201 and 202.

Figure 5:
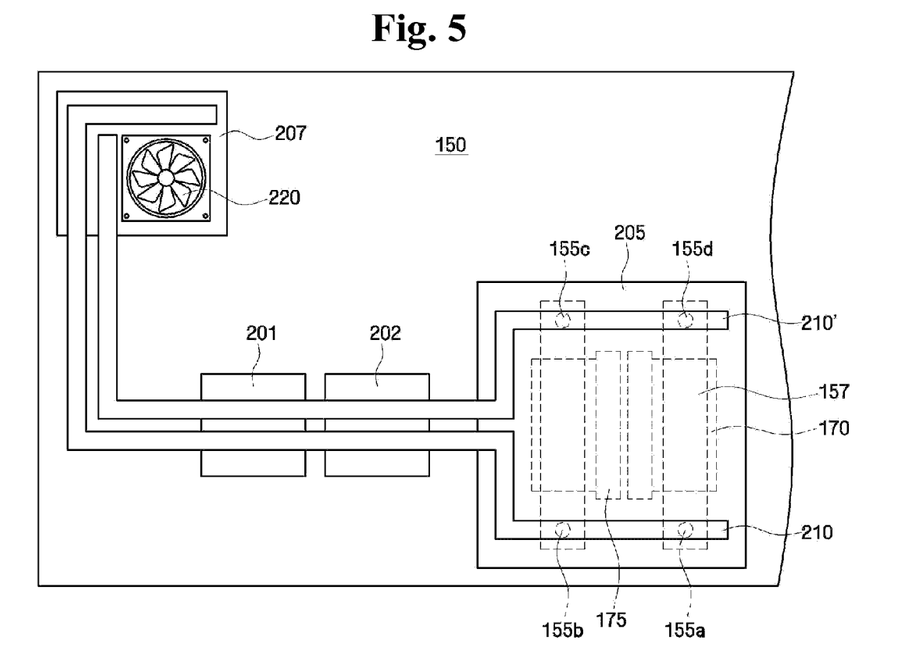
FIG. 5 is a plan view of a circuit board of the portable computer shown in FIG. 1.

FIG. 5 is a plan view of a circuit board of the portable computer shown in FIG. 1.

Referring to FIG. 5, one end of the heat pipe 210 may be placed on the top surface of the circuit board 150 in a region where the memory card 170 is mounted, and the one end of the heat pipe 210 may be thermoconductively connected to the thread pipe 155 to absorb the heat transferred to the thread pipe 155. The heat pipe 210 may directly contact the thread pipe 155, but embodiments are not limited thereto. The heat sink 205 may be disposed on the thread pipe 155 and the heat pipe 210 is disposed on the heat sink 205, thereby thermoconductively connecting the connecting member 155 to the heat pipe 210.

The heat sink 207 may be attached to the other end of the heat pipe 210, and the cooling fan 220 may be disposed over the heat sink 207. The cooling fan 220 discharges the heat transferred to the heat sink 207 to the outside of the main body 110 through the vent hole 133 formed in the lower housing 130.

While FIG. 5 illustrates that two heat pipes 210 and 210' are mounted on the circuit board 150, the present inventive concept is not limited thereto. The number of the heat pipes 210 may vary as required by one skilled in the art.

Hereinafter, a portable computer according to another embodiment of the present inventive concept will be described. In the illustrated embodiment, the same configurations as those of the previous embodiment will not be described or briefly described.

Figure 6:
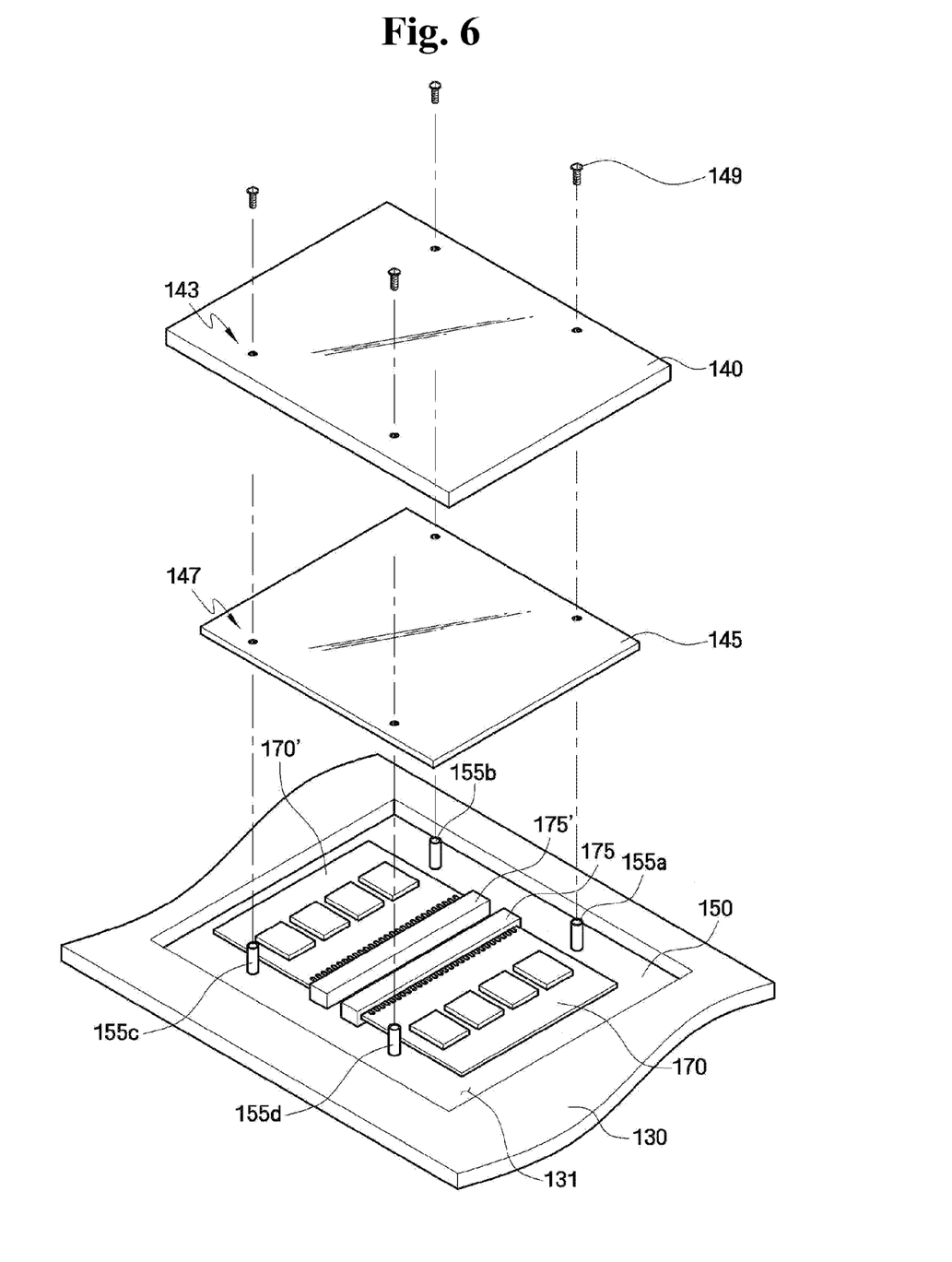
FIG. 6 illustrates an opening formed in a lower housing of a portable computer according to another exemplary embodiment.
Figure 7:
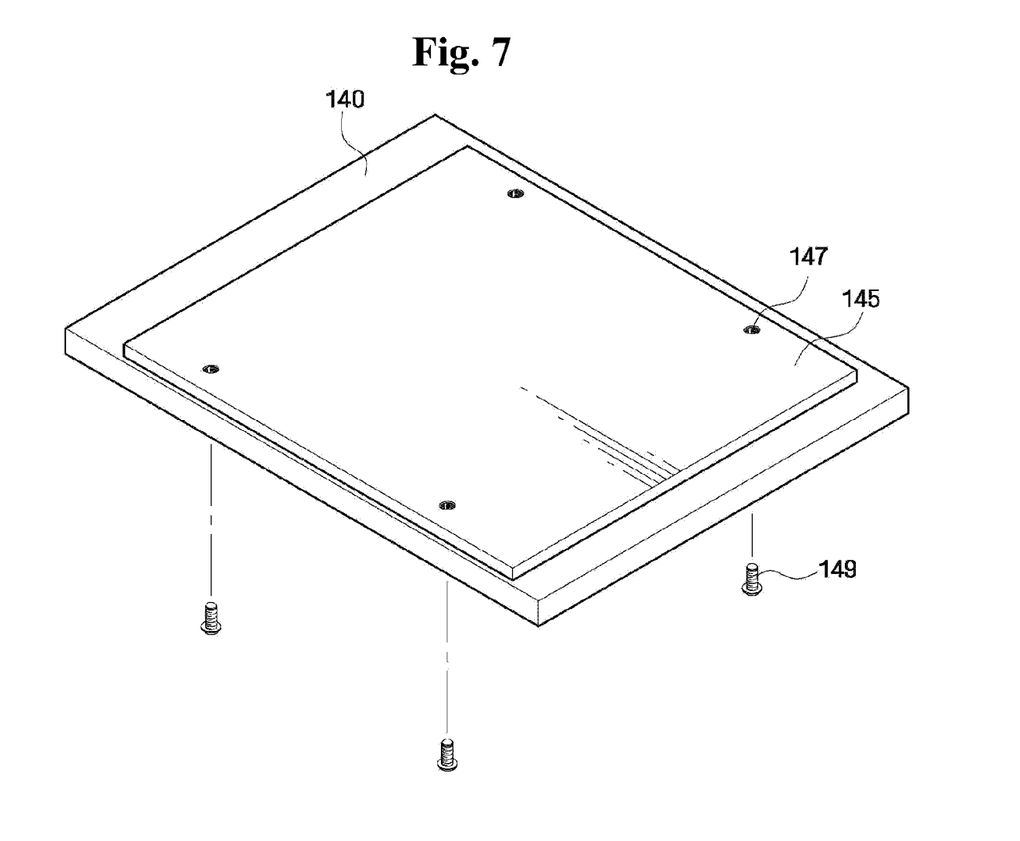
FIG. 7 illustrates a cover covering the opening shown in FIG. 6.

FIG. 6 illustrates an opening formed in a lower housing of a portable computer according to another embodiment of the present inventive concept, and FIG. 7 illustrates a cover covering the opening shown in FIG. 6.

Referring to FIGS. 6 and 7, a memory heat sink 145 may be formed on one surface of a cover 140 facing a memory card 170. The memory heat sink 145 may be substantially rectangular and made of a highly thermoconductive material such as copper, aluminum, or a tungsten-copper alloy. When the cover 140 covers an opening 131, the memory heat sink 145 may thermoconductively contact the one surface of the memory card 170. For example, the memory heat sink 145 may directly contact the one surface of the memory card 170 and may be thermoconductively connected to the one surface of the memory card 170 through a thermal compound 185 (see FIG. 8) interposed between the one surface of the memory card 170 and the memory heat sink 145. The memory heat sink 145, which thermoconductively contacts the one surface of the memory card 170, absorbs the heat generated from the memory card 170.

A thread pipe 155 penetrates a circuit board 150 and thermoconductively connects to the memory heat sink 145 formed in the cover 140 and a heat pipe 210 formed on the top surface of the circuit board 150. For example, a heat sink 205 may be disposed over the thread pipe 155 and the heat pipe 210 may be disposed over the heat sink 205, but embodiments are not limited thereto. The thread pipe 155 may be directly connected to the heat pipe 210 without the heat sink 205. Therefore, the heat generated from the memory card 170 may be absorbed by the memory heat sink 145 and the absorbed heat may be transferred to the heat pipe 210 through the thread pipe 155.

The cover 140 may be engaged with the thread pipe 155 to then cover the opening 131. For example, one end of the thread pipe 155 may contact the memory heat sink 145 attached to the cover 140, and a female thread 156 may be formed on the inner surface of the one end thereof contacting the memory heat sink 145. A first through-hole 147 may be formed at a portion of the memory heat sink 145 contacting the thread pipe 155. A second through-hole 143 may be formed at a portion of the cover 140, the portion corresponding to the first through-hole 147 of the memory heat sink 145. A bolt 149 is inserted through the first through-hole 143 and the second through-hole 147 to then be engaged with a female thread 156 formed in the thread pipe 155. Therefore, the cover 140 may be fixed to the thread pipe 155 and may cover the opening 131.

Figure 8:
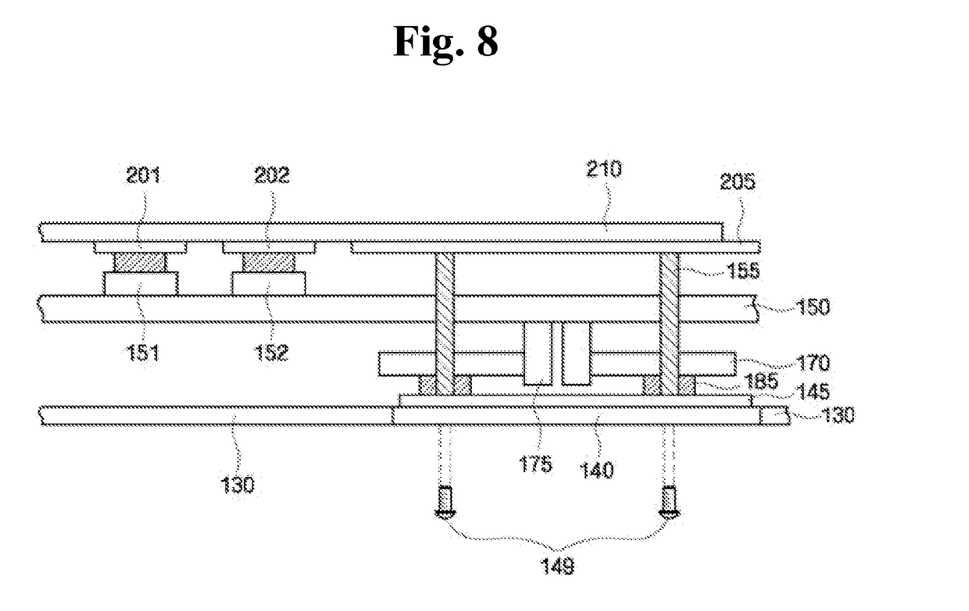
FIG. 8 illustrates a connection relationship between a circuit board, a heat pipe and a memory card of the portable computer shown in FIG. 6.

FIG. 8 illustrates a connection relationship between a circuit board, a heat pipe and a memory card of the portable computer shown in FIG. 6.

Referring to FIG. 8, a memory socket 175 is attached to a bottom surface of a circuit board 150, and a memory card 170 is inserted into the memory socket 175. A memory heat sink 145 is attached to a surface of the circuit board 150 facing the memory card 170. When the cover 140 is closed, the memory heat sink 145 closely contacts the memory card 170 and is thermoconductively contacted thereto. For example, the memory card 170 may directly contact the memory heat sink 145. In addition, the memory card 170 may be thermoconductively connected to the memory heat sink 145 through the thermal compound 185 interposed between the memory heat sink 145 and the memory card 170.

The thread pipe 155 penetrates the circuit board 150 and thermoconductively connects the memory heat sink 145 and the heat pipe 210. Therefore, the heat generated from the memory card 170 is absorbed by the memory heat sink 145, and the heat absorbed by the memory heat sink 145 is transferred to the heat pipe 210 through the thread pipe 155.

Hereinafter, a portable computer according to still another exemplary embodiment will be described. In the illustrated embodiment, the same configurations as those of the previous embodiments will not be described or briefly described.

Figure 9:
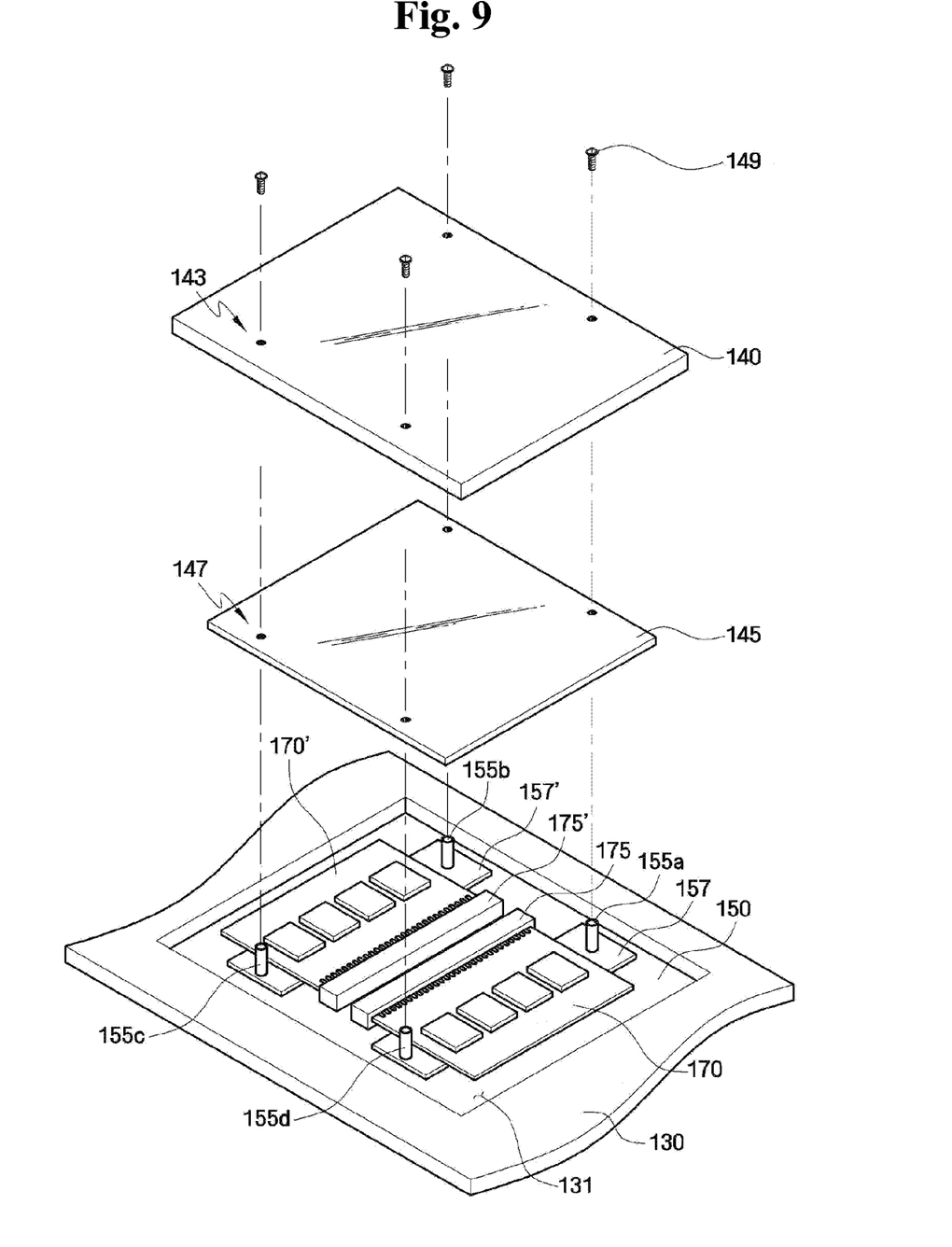
FIG. 9 illustrates an opening formed in a lower housing of a portable computer according to still another embodiment of the present inventive concept.

FIG. 9 illustrates an opening formed in a lower housing of a portable computer according to still another embodiment of the present inventive concept.

Referring to FIG. 9, a first memory heat sink 157 may be formed on a bottom surface of a circuit board 150 facing a memory card 170, and a second memory heat sink 145 may be formed on a surface of a cover 140 facing the memory card 170. When the memory card 170 is inserted into a memory socket 175, the first memory heat sink 157 closely contacts one surface of the memory card 170 and is thermoconductively connected thereto. For example, the first memory heat sink 157 may directly contact the memory card 170. In addition, the first memory heat sink 157 may be thermoconductively connected to the one surface of the memory card 170 through a thermal compound 190 (see FIG. 10) interposed between the one surface of the memory card 170 and the first memory heat sink 157.

The second memory heat sink 145 may be thermoconductively connected to the other surface of the memory card 170. For example, the second memory heat sink 145 may directly contact the other surface of the memory card 170. Alternatively, the second memory heat sink 145 may be thermoconductively connected to the other surface of the memory card 170 through a thermal compound 195 (see FIG. 10) interposed between the other surface of the memory card 170 and the second memory heat sink 145.

The first memory heat sink 157 and the second memory heat sink 145 absorb the heat generated from the memory card 170.

A thread pipe 155 penetrates the circuit board 150 and the first memory heat sink 157 and thermoconductively connects the second memory heat sink 145 formed in the cover 140 and the heat pipe 210 formed on the top surface of the circuit board 150. Therefore, the heat generated from the memory card 170 is absorbed by the first memory heat sink 157 and the second memory heat sink 145. The heat absorbed by the first memory heat sink 157 and the second memory heat sink 145 may be transferred to the heat pipe 210 through the thread pipe 155.

The cover 140 is engaged with a thread pipe 155 to cover an opening 131. For example, one end of the thread pipe 155 contacts the second memory heat sink 145 attached to the cover 140, and a female thread 156 may be formed on the inner surface of the one end thereof contacting the second memory heat sink 145. A first through-hole 147 may be formed at a portion of the second memory heat sink 145 contacting the thread pipe 155. A second through-hole 143 may be formed at a portion of the second memory heat sink 145, the portion corresponding to the first through-hole 147 of the second memory heat sink 145. A bolt 149 is inserted through the first through-hole 143 and the second through-hole 147 to then be engaged with a female thread 156 formed in the thread pipe 155. Therefore, the cover 140 may be fixed to the thread pipe 155 and may cover the opening 131.

Figure 10:
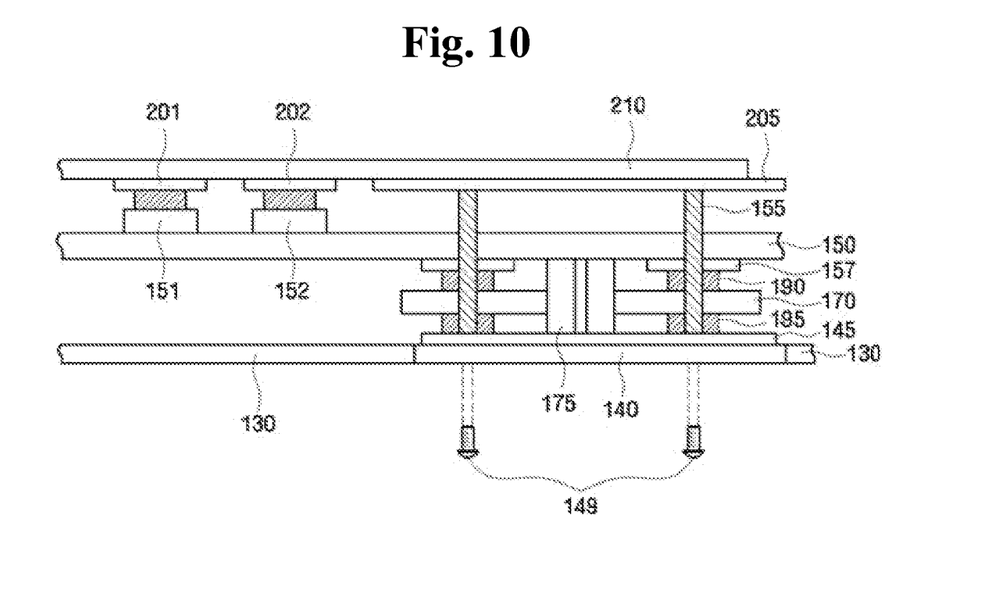
FIG. 10 illustrates a connection relationship between a circuit board, a heat pipe and a memory card of the portable computer shown in FIG. 9.

FIG. 10 illustrates a connection relationship between a circuit board, a heat pipe and a memory card of the portable computer shown in FIG. 9.

Referring to FIG. 10, a memory socket 175 is attached to a bottom surface of a circuit board 150, and a memory card 170 is inserted into the memory socket 175. A memory heat sink 145 is attached to a surface of the circuit board 150 facing the memory card 170. When the cover 140 is closed, the memory heat sink 145 closely contacts the memory card 170 and is thermoconductively connected thereto.

A thread pipe 155 penetrates the circuit board 150 and the first memory heat sink 157 and contacts the second memory heat sink 145, thereby thermoconductively connecting the first memory heat sink 157 and the second memory heat sink 145 to the heat pipe 210. Therefore, the heat generated from the memory card 170 is absorbed by the first memory heat sink 157 and the second memory heat sink 145. The heat absorbed by the first memory heat sink 157 and the second memory heat sink 145 is transferred to the heat pipe 210 through the thread pipe 155.

While exemplary embodiments have been particularly shown and described, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. An electronic device comprising:
   a circuit board;
   a heat pipe which is disposed on a first side of the circuit board;
   a heat generating device which is disposed on a second side of the circuit board opposite to the first side of the circuit board;
   a heat sink which is interposed between the circuit board and the heat generating device, wherein the heat sink is disposed on the second side of the circuit board and absorbs heat generated by the heat generating device; and
   a connecting member which penetrates through the circuit board and thermoconductively connects the heat pipe and the heat sink.

2. The electronic device of claim 1, wherein the heat generating device comprises a semiconductor device.

3. The electronic device of claim 1, further comprising a cooling fan which is disposed at an end of the heat pipe and circulates air to cool the heat pipe.

4. The electronic device of claim 1, wherein the heat sink is made of a thermoconductive material and has a plate shape with a flat surface facing the heat generating device.

5. The electronic device of claim 1, further comprising a thermal compound interposed between the heat generating device and the heat sink, wherein the thermal compound thermoconductively connects the heat generating device and the heat sink.

6. The electronic device of claim 1, wherein the connecting member is a pipe having a first end contacting the heat sink and a second end contacting the heat pipe, and the pipe made of a thermoconductive material.

7. An electronic device comprising:
   a circuit board;
   a heat pipe which is disposed on a first side of the circuit board;
   a memory card which is disposed on a second side of the circuit board opposite to the first side of the circuit board;
   a first heat sink which is disposed on the second side of the circuit board, and is thermoconductively connected to the memory card to absorb heat of the memory card; and
   a connecting member which penetrates the circuit board and thermoconductively connects the heat pipe and the first heat sink.

8. The electronic device of claim 7, wherein the connecting member is a pipe having a first end contacting the first heat sink and a second end contacting the heat pipe, and the pipe made of a thermoconductive material.

9. The electronic device of claim 7, further comprising a central processing unit (CPU) which is disposed on the first side of the circuit board, wherein the heat pipe is disposed on the CPU and absorbs heat from the CPU.

10. The electronic device of claim 7, further comprising a second heat sink which is interposed between the heat pipe and the connecting member and thermoconductively connects the heat pipe and the connecting member.

11. The electronic device of claim 7, further comprising a thermal compound interposed between the first heat sink and the memory card, wherein the thermal compound closely contacting the memory card and the first heat sink.

12. The electronic device of claim 7, further comprising a cooling fan disposed at an end of the heat pipe and cooling the heat pipe.

13. An electronic device comprising:
   a circuit board;
   a heat pipe which is disposed on a first side of the circuit board;
   a memory card which is disposed on a second side of the circuit board opposite to the first side of the circuit board;
   a lower housing which accommodates the circuit board and has an opening located at a position corresponding to the memory card and exposing the memory card;
   a cover which covers the opening;
   a first heat sink which is disposed on the second side of the circuit board, and is thermoconductively connected to the memory card to absorb heat generated by the memory card; and
   a connecting member which penetrates through the circuit board and thermoconductively connects the heat pipe and the first heat sink.

14. The electronic device of claim 13, wherein the connecting member is a pipe having a first end contacting the first heat sink and a second end contacting the heat pipe, and the pipe made of a thermoconductive material.

15. The electronic device of claim 14, wherein the first heat sink includes a first through-hole formed in at least one portion of the first heat sink contacting the connecting member, the cover includes a second through-hole corresponding to the first through-hole, and the connecting member includes a female thread,
   the electronic device further comprising a bolt which is inserted through the first through-hole and the second through-hole and is engaged with the female thread to fix the cover to the connecting member.

16. The electronic device of claim 13, further comprising a second heat sink which is interposed between the circuit board and the memory card and absorbs heat from the memory card, wherein the first heat sink is interposed between the memory card and the cover.

17. The electronic device of claim 16, wherein the second heat sink is thermoconductively connected to the connecting member.

18. The electronic device of claim 13, further comprising a central processing unit (CPU) which is disposed on the first side of the circuit board, wherein the heat pipe is disposed over the CPU and absorbs heat from the CPU.

19. The electronic device of claim 13, further comprising a cooling fan which is disposed at one end of the heat pipe and circulates air to cool the heat pipe.

20. The electronic device of claim 13, further comprising a thermal compound interposed between the first heat sink and the memory card, wherein the thermal compound thermoconductively connects the memory card and the first heat sink.

* * * * *